(12) United States Patent
Tsui et al.

(10) Patent No.: US 9,154,091 B2
(45) Date of Patent: Oct. 6, 2015

(54) OP-AMP SHARING TECHNIQUE TO REMOVE MEMORY EFFECT IN PIPELINED CIRCUIT

(71) Applicant: Supertex, Inc., Sunnyvale, CA (US)

(72) Inventors: Louis Hau-Yiu Tsui, Kowloon (HK); Isaac Terasuth Ko, Kowloon (HK)

(73) Assignee: Microchip Technologies, Inc., Chandler, AZ (US)

( * ) Notice: Subject to any disclaimer, the term of this patent is extended or adjusted under 35 U.S.C. 154(b) by 0 days.

(21) Appl. No.: 14/025,724

(22) Filed: Sep. 12, 2013

(65) Prior Publication Data

US 2014/0097897 A1 Apr. 10, 2014

Related U.S. Application Data

(60) Provisional application No. 61/711,425, filed on Oct. 9, 2012.

(51) Int. Cl.
*H03M 1/38* (2006.01)
*H03F 3/45* (2006.01)
*H03M 1/12* (2006.01)
*H03F 3/00* (2006.01)
*H03M 1/16* (2006.01)
*H03M 1/44* (2006.01)

(52) U.S. Cl.
CPC ............ *H03F 3/45179* (2013.01); *H03F 3/005* (2013.01); *H03M 1/1225* (2013.01); *H03M 1/167* (2013.01); *H03M 1/44* (2013.01)

(58) Field of Classification Search
CPC ...... H03M 1/0695; H03M 1/44; H03M 1/442; H03M 1/164; H03M 1/1245; H03M 1/466; H03M 1/804; H03M 1/0675
USPC .......................... 341/118, 120, 155, 161, 162
See application file for complete search history.

(56) References Cited

U.S. PATENT DOCUMENTS

| | | | | |
|---|---|---|---|---|
| 7,148,833 | B1* | 12/2006 | Cho et al. | 341/162 |
| 7,397,412 | B1* | 7/2008 | Cho | 341/161 |
| 7,471,227 | B2* | 12/2008 | Cho | 341/161 |
| 7,576,677 | B2* | 8/2009 | Morimoto | 341/162 |
| 7,612,700 | B2* | 11/2009 | Kawahito et al. | 341/161 |
| 8,471,753 | B1* | 6/2013 | Huang et al. | 341/161 |
| 8,686,889 | B2* | 4/2014 | Reddy et al. | 341/161 |
| 2002/0113726 | A1* | 8/2002 | Nagaraj | 341/156 |
| 2008/0042890 | A1* | 2/2008 | Cho | 341/161 |
| 2009/0072899 | A1* | 3/2009 | Cho et al. | 330/147 |
| 2009/0289821 | A1* | 11/2009 | Li et al. | 341/110 |
| 2010/0308930 | A1* | 12/2010 | Ayazi et al. | 331/154 |

* cited by examiner

*Primary Examiner* — Linh Nguyen
(74) *Attorney, Agent, or Firm* — DLA Piper LLP (US)

(57) ABSTRACT

This document describes a new op-amp sharing technique for pipeline ADC without memory effect. The key features of this technique are: the usage of negative impedance converter and scaled replica of the op-amp input device to achieve zero error voltage, which in turns achieve low power dissipation due to the removal of the tradeoff between op-amp sharing and memory effect. With this technique much lower operation of pipeline ADC can be achieved for applications of data communications and image signal processing.

20 Claims, 6 Drawing Sheets

(12) United States Patent — US 9,154,091 B2

OP-AMP SHARING TECHNIQUE TO REMOVE MEMORY EFFECT IN PIPELINED CIRCUIT

PRIORITY CLAIM

This application claims the benefit under 35 USC 119(e) to U.S. Provisional Patent Application Ser. No. 61/711,425, filed on Oct. 9, 2012 and titled "OP-AMP Sharing Technique to Remove Memory Effect in Pipelined ADC," which is incorporated by reference herein.

TECHNICAL FIELD

The present invention relates to op-amp sharing techniques for a pipelined, circuit, such as an analog-to-digital converter (ADC), without the memory effect present in the prior art.

BACKGROUND OF THE INVENTION

High-speed ADCs are important in a wide variety of commercial applications including data communications and image signal processing. In such applications, the reduction of power consumption associated with high-speed sampling and quantization is one key design issue in enhancing portability and battery operation.

In general, pipelined ADCs are very efficient architectures for meeting the low power dissipation and high input bandwidth requirements of these applications. In a pipelined ADC, op-amps are used in the first stage to sample the high frequency input and also in the subsequent stages to sample the residue from the previous stage. This feature allows each stage of the pipeline to begin processing a new sample as soon as its residue is sampled by the following stage, and also allows all stages to operate concurrently, giving a throughput of one output sample per clock cycle. Thus, pipelined ADCs can operate at high sampling rates with high dynamic range.

To further reduce power consumption of a pipelined ADC, an op-amp can be shared between two successive pipeline stages to obtain a power-efficient architecture. Due to the switched-capacitor architecture of general pipelined ADC, every op-amp is occupied for only half clock cycle, the multiplying digital-to-analog conversion (MDAC) phase, and is idle in another half clock cycle. Therefore, the same op-amp can be shared between two consecutive pipeline stages by adding more switches.

However, op-amp sharing has an inherent drawback. Since the input node of the op-amp is never reset, the MDAC output depends on the previous residue, thus degrading the linearity of the overall converter. This is often referred to as memory effect. Op-amp sharing introduces the memory effect as the nonzero input voltage of the op-amp (resulting from its finite gain) is never reset. Thus, every input sample is affected by the finite-gain error component from the previous sample. The memory effect between the first two MSB conversion stages is particularly detrimental.

This memory effect can be suppressed by resetting the op-amp input before sampling the ADC input. The timing for the reset signal can be made between the two clock phases as shown in FIGS. 1A-1D. FIG. 1A depicts a timing diagram for the clock $\emptyset_1$ for the first phase, the clock $\emptyset_2$ for the second phase, and the reset signal $\emptyset_{DS}$. FIG. 1B depicts the first phase when $\emptyset_1$ is high. FIG. 1C depicts the reset stage. FIG. 1D depicts the second phase when $\emptyset_2$ is high. The drawback associated with the architecture of FIGS. 1A-1D is the additional clock phase, the reduction of conversion time, and the fast settling requirement of op-amp.

In order to solve this problem, some people propose a feedback signal polarity inverting technique between two sharing phases, as shown in FIGS. 2A-2B. FIG. 2A depicts the first phase, and FIG. 2B depicts the second phase. With the feedback signal polarity inverting technique, the error voltage of the given op-amp sharing stage can be reduced to one third of the conventional error voltage. FIGS. 2A-2B show how to implement this technique.

The memory effects of op-amp sharing can also be mitigated with a low input-capacitance op-amp. The low input-capacitance op-amp is shown in FIG. 3. The op-amp is based on pre-amplification and has the desirable property of having a low input-capacitance. Lower input capacitance helps to increase the feedback factor and reduce memory effects. However, a non-dominant pole associated with the preamplifier output node will reduce the phase margin.

What is needed is a method and system of op-amp sharing without the drawbacks found in the prior art, such as the memory effect.

SUMMARY OF THE INVENTION

In order to solve the problem found in the prior art, we propose a positive feedback technique to induce the same amplitude but opposite polarity of the error component. With the technique, the memory effect of the given op-amp sharing stage can be completely cancelled.

DETAILED DESCRIPTION OF THE PREFERRED EMBODIMENTS

Although both feedback signal polarity inverting technique and low input-capacitance op-amp can reduce the error voltage of the op-amp sharing stage to a fraction of the conventional scheme, neither of them can completely removed the error component.

Figure 1A:
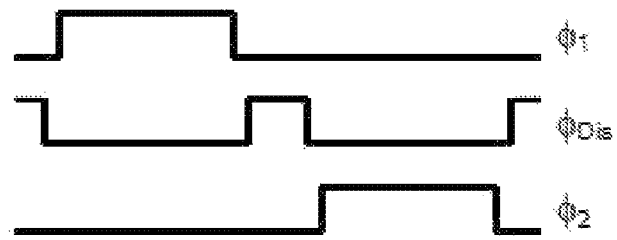
FIGS. 1A-1D depicts a prior art system with an op-amp shared between two phases.
Figure 1B:
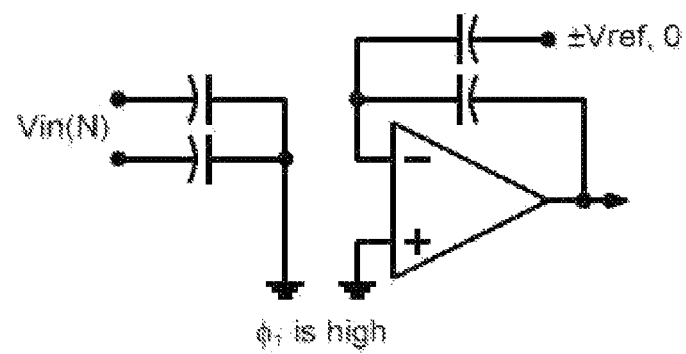
Figure 1C:
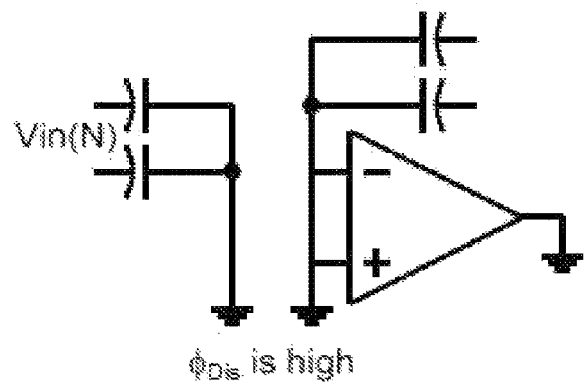
Figure 1D:
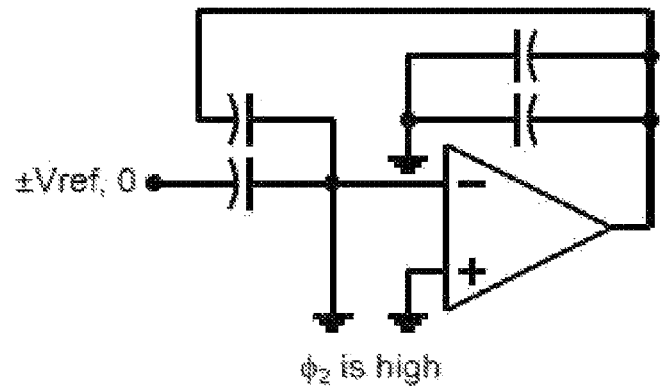
Figure 2A:
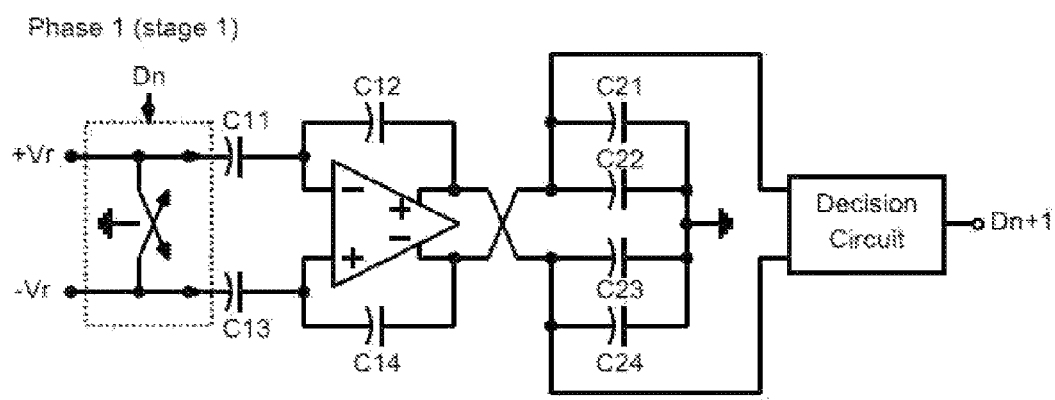
FIGS. 2A-2B depicts another prior art system with an op-amp shared between two phases.
Figure 2B:
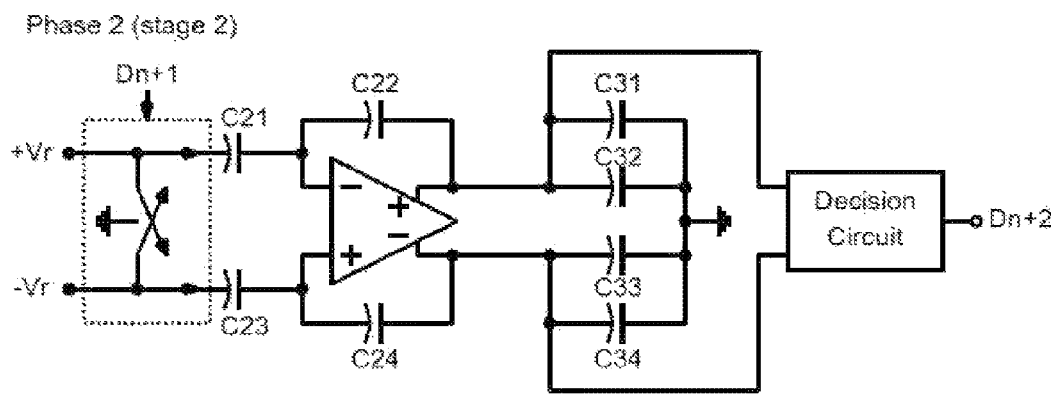
Figure 3:
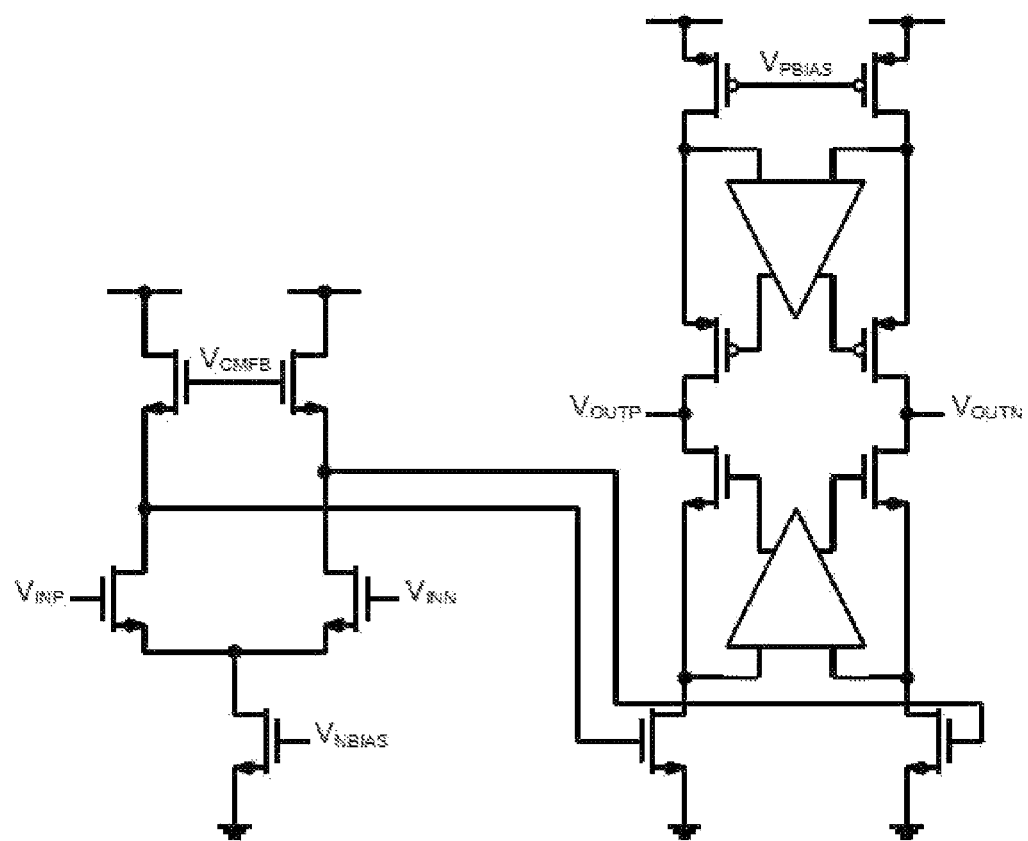
FIG. 3 depicts another prior art system with an op-amp shared between two phases.
Figure 4:
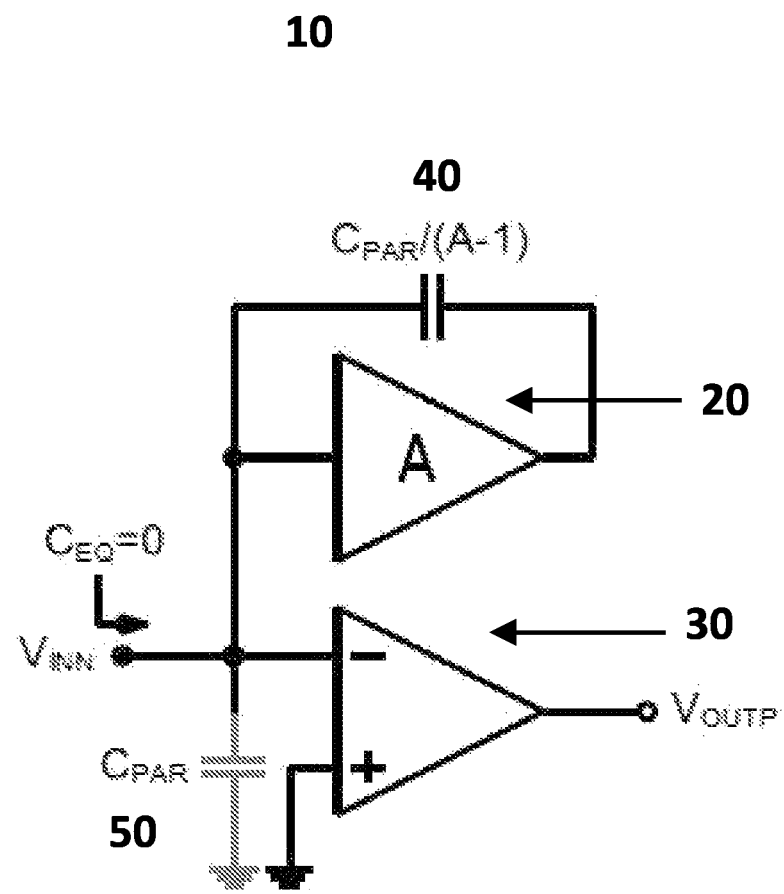
FIG. 4 depicts an embodiment of an operational amplifier circuit.

An embodiment is shown in FIG. 4. FIG. 4 shows how to construct the new op-amp 10 which is free of memory effect. Op-amp 10 comprises the main amplifier 30 and a negative impedance converter 20. Main amplifier 30 has a parasitic capacitor 50 (called $C_{PAR}$). Main amplifier is coupled to positive feedback capacitor 40 (with value $C_{PAR}/(A-1)$) as shown. The equivalent input capacitance is as follows, indicating that the circuit simulates a negative capacitance in parallel with its parasitic capacitor.

$$C_{EQ} = C_{PAR} + (1-A)/(A-1) = 0$$

The meaning of the zero capacitance for $C_{EQ}$ is that the memory effect of the negative impedance converter 20 is now actually opposite to that of the main amplifier 30, causing the complete cancellation of the error voltage. Consequently, the new op-amp 10 is free of memory effect.

If A=2, then $C_{PAR}/(A-1)=C_{PAR}$. In this case the positive feedback capacitor 40 is equal to the input capacitance of the main amplifier 30, making the feedback capacitor 40 an exact replica of the input device modeled as parasitic capacitor 50 of the main amplifier 30. Consequently, the matching is accurate and effortless.

Thus, in this embodiment, a negative capacitance is used to neutralize unwanted parasitic capacitance, as in the design of high-speed amplifiers, or to control pole location, as in the design of active filters and oscillators.

Looking back at the op-amps covered so far, note that by adding suitable negative impedance converters at the inputs we can configure them to zero memory-effect amplifiers. This implies the technique is universal.

Figure 5:
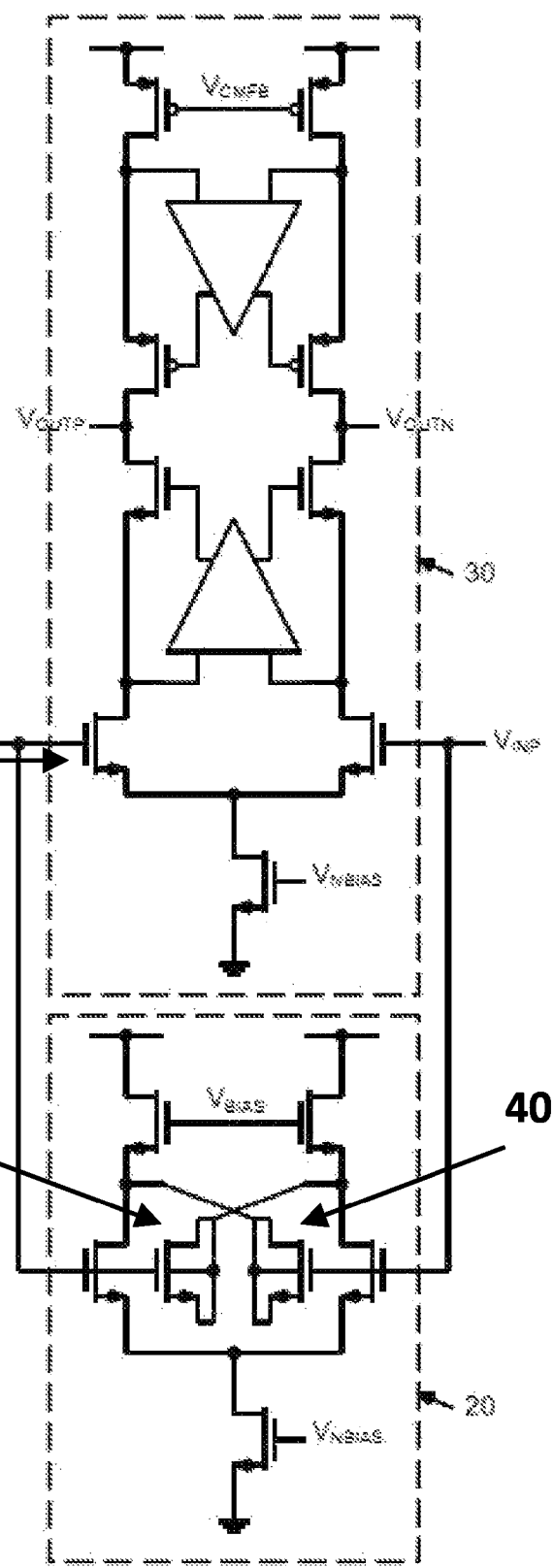
FIG. 5 depicts an embodiment of an operational amplifier circuit.

Additional detail of an embodiment is shown in FIG. 5. Shared op-amp circuit 100 comprises main amplifier 30 and negative impedance converter 20, as well as other components as shown in FIG. 5.

The optimum value for the gain A of the negative impedance converter 20 is from 2 to 10. In the particular technology used for the example of FIG. 5, the body of NMOS transistors can be isolated with deep n-wells. Thus, the positive feedback capacitor 40 comprises the 1/(A−1) scaled replicas of the input NMOS 35 of the main amplifier 30. The positive feedback capacitor 40 biased at accumulation region should be further scaled by ⅔ to account for the input NMOS Cgs of the main amplifier in saturation region. The common-mode feedback of the main amplifier 30 can be conventional switched-capacitor circuit and is not shown for simplification.

Figure 6:
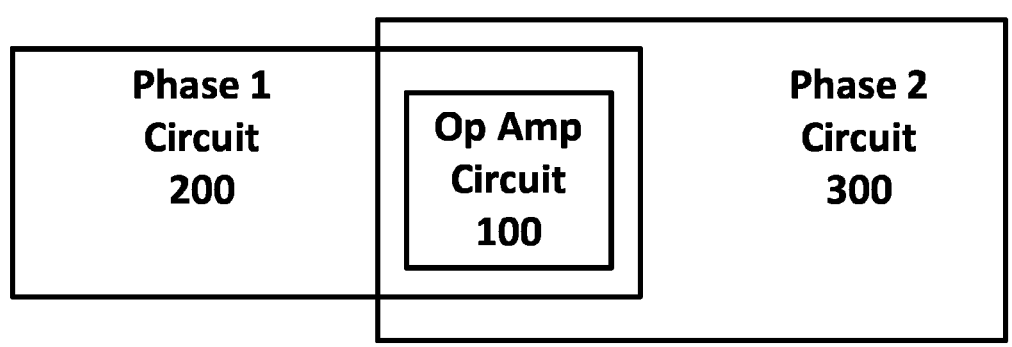
FIG. 6 depicts an embodiment of a pipelined circuit utilizing a shared operational amplifier circuit of FIG. 4 or 5.

With reference to FIG. 6, a pipelined circuit 400 is depicted. Pipelined circuit 400 comprises phase 1 circuit 200 (which operates during a first period) and phase 2 circuit 300 (which operates during a second period). Phase 1 circuit 200 and phase 2 circuit each utilize shared op-amp circuit 100 (or op-amp 10, not shown). Unlike the prior art, pipelined circuit 400 does not have any memory effect or undesirable phase error.

What is claimed is:

1. An operational amplifier circuit, comprising:
   a first operational amplifier comprising a first positive input coupled to ground, a first negative input coupled to an input signal, a first output, and a parasitic capacitor coupled to the first negative input;
   a second operational amplifier comprising a second positive input coupled to the first positive input, a second negative input coupled to the first negative input, and a second output, wherein the second output is coupled to the second negative input;
   a capacitor coupled between the second negative input and the second output;
   wherein the first output comprises no memory effect when the operational amplifier circuit is shared by multiple stages of a pipelined circuit.

2. The operational amplifier circuit of claim 1, wherein the second operational amplifier has a gain of A, the parasitic capacitor has a value of $C_{PAR}$, and the capacitor has a value of $C_{PAR}/(A-1)$.

3. The operational amplifier circuit of claim 2, wherein A=2.

4. The operational amplifier circuit of claim 1, wherein the capacitor neutralizes the parasitic capacitor.

5. The operational amplifier circuit of claim 1, wherein an input capacitance of the first operational amplifier is zero.

6. A pipelined circuit, comprising:
   a first circuit coupled to an operational amplifier circuit during a first period; and
   a second circuit coupled to the operational amplifier circuit during a second period;
   the operational amplifier circuit, comprising:
      a main amplifier comprising a parasitic capacitor;
      a negative impedance converter coupled to the main amplifier; and
      a capacitor coupled to the negative impedance converter to offset the parasitic capacitor.

7. The pipelined circuit of claim 6, wherein the negative impedance converter has a gain of A, the parasitic capacitor has a value of $C_{PAR}$, and the capacitor has a value of $C_{PAR}/(A-1)$.

8. The pipelined circuit of claim 7, wherein A=2.

9. The pipelined circuit of claim 6, wherein an input capacitance of the main amplifier is zero.

10. A pipelined circuit, comprising:
    a first circuit coupled to an operational amplifier circuit during a first period;
    a second circuit coupled to the operational amplifier during a second period;
    the operational amplifier circuit comprising:
       a first operational amplifier comprising a first positive input coupled to ground, a first negative input coupled to an input signal, a first output, and a parasitic capacitor coupled to the first negative input;
       a second operational amplifier comprising a second positive input coupled to the first positive input, a second negative input coupled to the first negative input, and a second output, wherein the second output is coupled to the second negative input;
       a capacitor coupled between the second negative input and the second output;
    wherein the operational amplifier circuit generates no memory effect.

11. The pipelined circuit of claim 10, wherein the second operational amplifier has a gain of A, the parasitic capacitor has a value of $C_{PAR}$, and the capacitor has a value of $C_{PAR}/(A-1)$.

12. The pipelined circuit of claim 11, wherein A=2.

13. The pipelined circuit of claim 10, wherein an input capacitance of the first operational amplifier is zero.

14. The pipelined circuit of claim 10, wherein the pipelined circuit is an analog-to-digital converter.

15. A method of operating a pipelined circuit, comprising:
    coupling a first circuit coupled to an operational amplifier circuit during a first period; and
    coupling a second circuit to the operational amplifier during a second period;
    wherein the operational amplifier circuit comprises:
       a first operational amplifier comprising a first positive input coupled to ground, a first negative input coupled to an input signal, a first output, and a parasitic capacitor coupled to the first negative input;
       a second operational amplifier comprising a second positive input coupled to the first positive input, a second negative input coupled to the first negative input, and a second output, wherein the second output is coupled to the second negative input;
       a capacitor coupled between the second negative input and the second output; and
    wherein the operational amplifier circuit generates no memory effect during the second period.

16. The method of claim 15, wherein the second operational amplifier has a gain of A, the parasitic capacitor has a value of $C_{PAR}$, and the capacitor has a value of $C_{PAR}/(A-1)$.

17. The method of claim 16, wherein A=2.

18. The method of claim 15, wherein the pipelined circuit is an analog-to-digital converter.

19. The method of claim 15, wherein an input capacitance of the first operational amplifier is zero.

20. The method of claim 15, wherein the step of coupling a first circuit to an operational amplifier circuit during a first period utilizes one or more switched capacitors, and the step of coupling a second circuit to the operational amplifier during a second period utilizes one or more switched capacitors.

* * * * *